(12) United States Patent
Gabara

(10) Patent No.: US 6,445,241 B2
(45) Date of Patent: Sep. 3, 2002

(54) ASYMMETRICAL CURRENT STEERING OUTPUT DRIVER WITH COMPACT DIMENSIONS

(75) Inventor: Thaddeus John Gabara, Murray Hill, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/935,814

(22) Filed: Aug. 23, 2001

Related U.S. Application Data

(62) Division of application No. 09/087,538, filed on May 29, 1998, now Pat. No. 6,294,947.

(51) Int. Cl.[7] .............................................. H03K 17/62
(52) U.S. Cl. ....................... 327/404; 327/308; 327/518
(58) Field of Search ................................. 327/403, 404, 327/493, 308, 518, 520, 511, 108; 323/311, 312, 315

(56) References Cited

U.S. PATENT DOCUMENTS

| | | | | |
|---|---|---|---|---|
| 5,408,497 A | * | 4/1995 | Baumann et al. ............... 375/7 |
| 5,418,478 A | * | 5/1995 | Van Brunt et al. ............ 326/86 |
| 5,635,859 A | * | 6/1997 | Yakota et al. .................. 326/67 |
| 5,966,042 A | * | 10/1999 | Werner et al. ............... 327/424 |
| 5,977,796 A | * | 11/1999 | Gabara ......................... 326/86 |
| 6,025,742 A | * | 2/2000 | Chan ........................... 327/108 |
| 6,294,947 B1 | * | 9/2001 | Gabara ......................... 327/403 |
| 6,307,402 B1 | * | 10/2001 | Hedberg ....................... 326/86 |
| 6,377,586 B1 | * | 1/2002 | Aizawa ....................... 327/108 |

* cited by examiner

Primary Examiner—Timothy P. Callahan
Assistant Examiner—Hai L. Nguyen

(57) ABSTRACT

A current output circuit with two output nodes connectable to a load and providing a plurality of discretely selectable current output magnitudes is provided. The circuit consists of a current driver attached across the output nodes supplying a particular current and one or more bypass resistors connected in parallel with the output nodes that can be switched between a non-conducting state and a resistive conducting state. When a load is connected across said output nodes, the particular magnitude of current sourced through the load can be selected by switching the state of the bypass resistors. The magnitude of the bypass resistors is preselected to provide several discretely selectable states of output current of substantial equal steps. The current driver can be combined with a current switch to increase the number of output states. Several current drivers with current switches may be provided and the bypass resistors integrated into the current switch itself.

11 Claims, 12 Drawing Sheets

ASYMMETRICAL CURRENT STEERING OUTPUT DRIVER WITH COMPACT DIMENSIONS

This is a division, of application Ser. No. 09/087,538, filed May 29, 1998 now U.S. Pat. No. 6,294,947. Each of these prior applications is hereby incorporated herein by reference, in its entirety.

TECHNICAL FIELD

This invention relates to a current mode output circuit. More particularly, this invention relates to an output circuit with a discretely variable output current.

BACKGROUND OF THE INVENTION

One type of data interface uses changes in the magnitude of a current to transmit data signals. In the simplest case, one state is represented by the presence of a current flow and another by the absence of current. An output circuit of this type using a switch S to connect a current driver through the output nodes to a load $R_L$ is shown in FIG. 1a.

Other conventional data interfaces, such as those used in SCSI architecture, require a current to be always present on an active interface. The direction of current flow indicates whether the transmitted signal is a logic 0 or a logic 1. A conventional current steering output buffer of this type is illustrated in FIG. 1b. The circuit contains a current driver which is connected to the output nodes by a current switch. In a first state, switch pair $S_A$ is closed, switch pair $S_B$ is open, and the current driver contributes a current I to the total load current. In a second state, switch pair $S_B$ is closed, switch pair $S_A$ is open, and the current driver contributes a current of -I to the total load current. In conventional systems, current may be turned off by opening both switch pairs $S_A$ and $S_B$.

As performance of integrated circuits continues to increase, the limited number of I/O (input/output) pins demands better utilization. Incorporating an output signal with more than the two conventional digital output states over a wire allows the interconnect of the I/O to carry a larger data bandwidth. Previous attempts to do this have used signalling via multiple voltage levels. However, in many circumstances, it is preferable to use current signaling instead. Further, conventional circuits generate switching noise at either of the power supply leads as the amount of power flowing into the output circuit is continuously changed to thereby vary the output signal level.

SUMMARY Of THE INVENTION

According to the present invention, an output buffer is provided that utilizes current signaling to provide a multi-level data output and draws a constant amount of current from the power supply regardless of the output level, thus reducing switching noise and startup delays. An output buffer circuit according to a first embodiment of the present invention has a current driver supplying a current I which is connectable to a load resistance. The connection may be through a current switch. The circuit also has one or more bypass resistors which can be switchable connected in parallel with the load resistance or disconnected from the circuit. When a bypass resistor is switched in parallel with the load resistor, some of the output current is diverted through the bypass resistor, thus reducing the current supplied to the load. For N switched bypass resistors, there are $2^N$ possible resistor state combinations. By choosing appropriate resistance values for the bypass resistors, the current through the load resistor may be varied in $2^N$ discrete. The number of states may be increased to $2^{N+1}+1$ if a current switch which allows the direction of the output current to be reversed or stopped is included in the output circuit. According to the invention, a zero-current output state is achieved by closing all switches in the current switch, instead of opening them. In this state, the introduced current flows equally in both directions through the load and therefore does not contribute a net current even though the given current driver is still sourcing current. Because the effect of a current driver on the load current may be eliminated without shutting off the current, it is possible to avoid startup delay and noise which would be introduced if the current switch were disconnected from the circuit by opening all the internal switches. Preferably, N bypass resistors are provided having appropriate resistances to provide at least N equal current steps for each current direction.

In another embodiment, a plurality of current drivers is provided and connected to the load resistance in parallel. It can be appreciated that when both of the current paths in a given current switch are active (e.g., all internal switches in a particular current switch are closed), no net current flow will be introduced into the load. However, the internal switches will also introduce a resistance in parallel with the load resistor. According to this aspect of the invention, the resistance of each internal switch is chosen so that when all internal switches are closed, the current switch provides a preselected effective resistance in parallel with the load which diverts current flow from other (active) current drivers and thereby reduces the current in the load by a predefined discrete amount. The magnitude of each current source and the effective resistance of the switches in each current switch can be chosen to minimize the number of redundant output states, and therefore maximize the number of possible output current steps.

A multiple-state current output circuit according to the present invention can be fabricated as an integrated circuit using MOS transistors and located on the same chip as its driving circuitry The present design allows for compact circuit dimensions when compared with conventional circuits of a similar type.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENTS

Figure 1A:
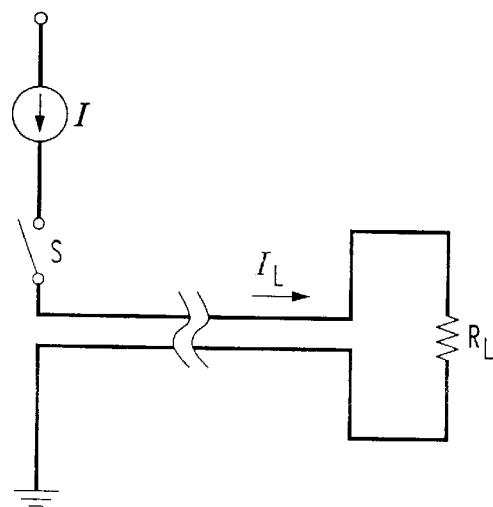
FIGS. 1a and 1b are ideal representations of conventional current output circuits.
Figure 1B:
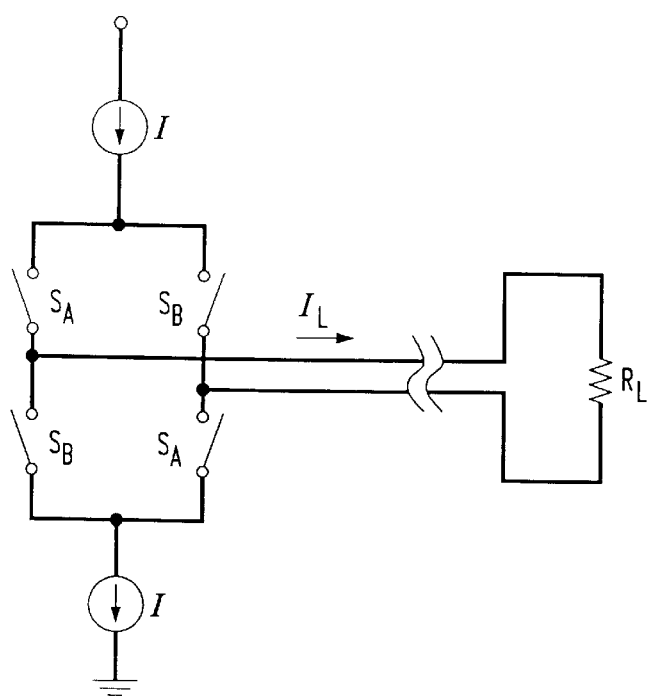
Figure 2:
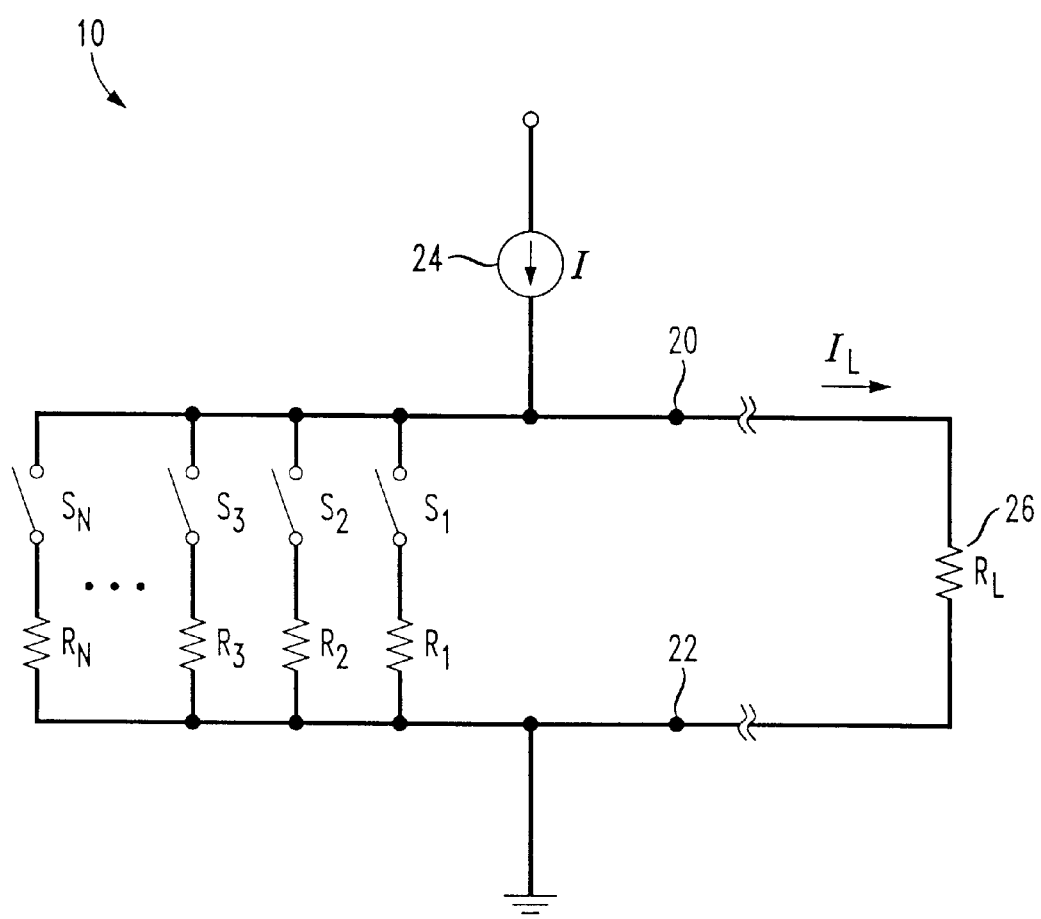
FIG. 2 is an ideal representation of an output circuit according to a first embodiment of the invention.

FIG. 2 is an ideal representation of an output circuit according to a first embodiment of the invention having two output nodes 20 and 22 and a current driver comprised of current source 24 which supplies a current I. The output driver is connected to a receiving unit, indicated as load resistance $R_L$ 26, through the output nodes 20, 22. According to the invention, one or more bypass resistors $R_1$ through $R_N$ are switchable connected in parallel with the load resistance $R_L$, e.g., by means of switches $S_1$ through $S_N$, to form switchable bypass resistor assemblies. By closing one or more of the switches, the current $I_L$ driven through the load 26 can be varied in discrete steps between a maximum current of I and a minimum current of $I_L=I*R_E/(R_L+R_E)$, where $R_E$ is the equivalent parallel resistance introduced when all N bypass resistors are conducting. Advantageously, the net current flow from the current driver 24 remains constant at I, even as the load current is changed. This reduces transient switching effects on the current driver and allows for high switching speeds and low output noise.

The value of bypass resistors $R_1$ through $R_N$ can be defined in terms of the expected load resistance $R_L$ and preferably are chosen so that the output buffer can source current in at least N+1 substantially equal output current steps. For example, if N=3, the value of the bypass resistors can be selected to provide, for example, four equal output current steps of magnitude I, ¾I, ½I, and ¼I. Depending on various design considerations, such as switching speed, device area, etc., several switching configurations may be used. In a "single-switch" configuration, four equal steps are achieved by switching only one bypass resistor at a time to a conducting state. In tabular form, this particular "single-switch" arrangement is summarized as:

| $S_1$ | $S_2$ | $S_3$ | $I_1$ |
|---|---|---|---|
| 0 | 0 | 0 | I |
| 1 | 0 | 0 | ¾ I |
| 0 | 1 | 0 | ½ I |
| 0 | 0 | 1 | ¼ I | where a "1" indicates that a switch is closed, i.e., the bypass resistor is conducting, and a "0" indicates that the switch is open, i.e., the bypass resistor is non-conducting. To achieve this result, the values of the bypass resistors are:

$R_1=3R_L$ $R_2=R_L$ $R_3=\frac{1}{3}R_L$

In the general case of M equal output current steps separated by I/M in a "single-switch" configuration, N=M−1 switched bypass resistors are provided. The values of each switched bypass resistor $R_n$ and the resulting load current $I_L$ when only that particular redidtor is conducting (only switch $S_n$ is closed) is given by equation 1:

$$R_n, I_{L(n)} \Big|_{n=1}^{N} = \frac{N-n+1}{n}R_L, \frac{N-n+1}{N+1}I \quad \text{(Equ. 1)}$$

Thus, for 8 equal stated, N=7 and the values of bypass resistors $R_1$ to $R_7$ is:

7/1$R_L$ 6/2$R_L$ 5/3$R_L$ 4/4$R_L$ 3/5$R_L$ 2/6$R_L$ 1/7$R_L$

The output current when only bypass resistor $R_n$ is conducting for n=1-7 is:

7/8I 6/8I 5/8I 4/8I 3/8I 2/8I 1/8I (The final state, output of I, is achieved when all resistors are non-conducting, i.e., no switch are closed).

Other figurations may also be used to achieve equal output current steps. For example, is a "lative parallel" configuration, the switches are closed successively, adding more than one bypass resistor in parallel with the load resistor at a time. The four states achieved in this configuration where N=3 may be represented as:

| $S_1$ | $S_2$ | $S_3$ | $I_1$ |
|---|---|---|---|
| 0 | 0 | 0 | I |
| 1 | 0 | 0 | ¾ I |
| 1 | 1 | 0 | ½ I |
| 1 | 1 | 1 | ¼ I |

To achieve this result, the values of the bypass resistors are configured as:

$R_1=3R_L$ $R_2=\frac{3}{2}R_L$ $R_3=\frac{1}{2}R_L$

Figure 3A:
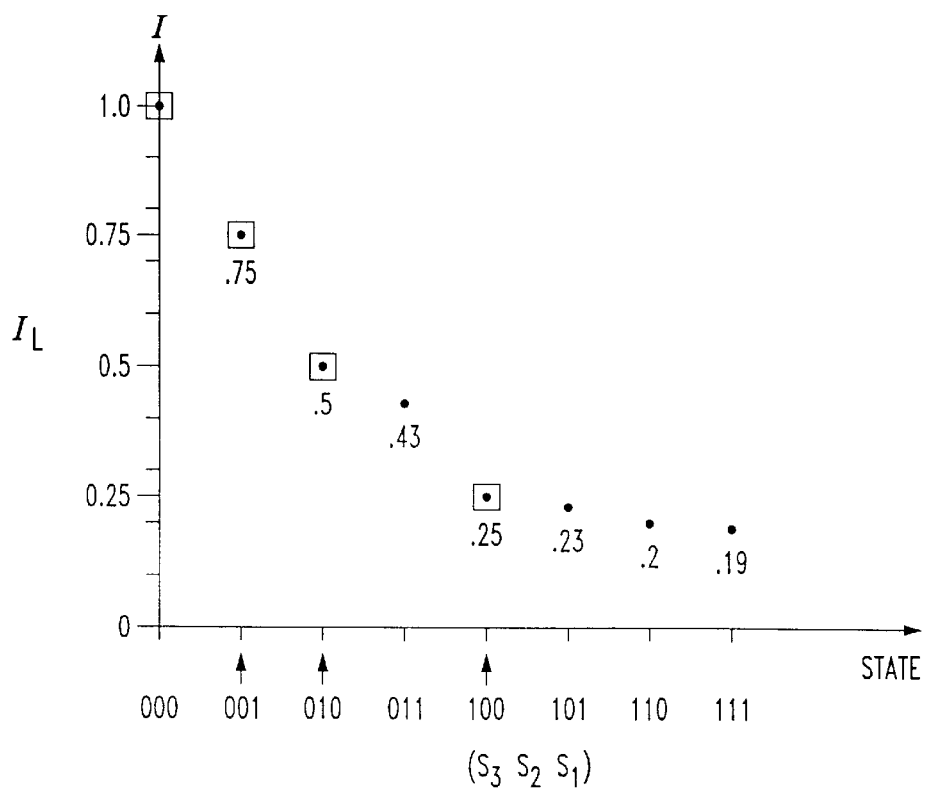
FIGS. 3a and 3b are graphs of load current for various switch states and resistance values in the circuit of FIG. 2.
Figure 3B:
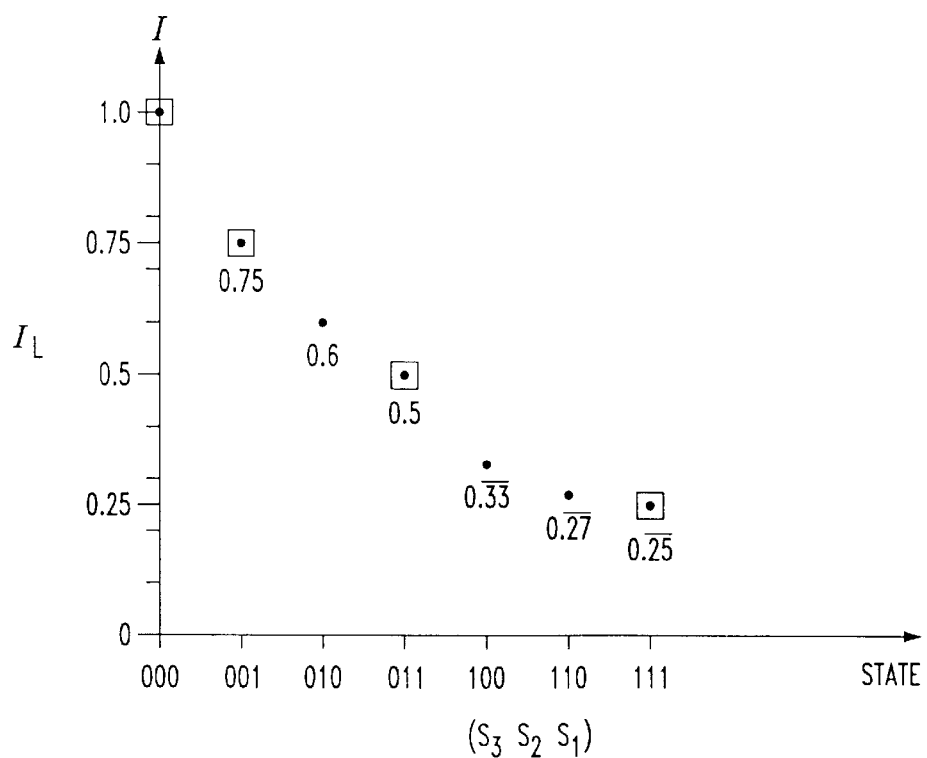

It can be appreciated that even though the resistor values may be optimized to provide equal current steps for certain switch configurations, such as the single-switch or cumulative-parallel configurations discussed above, all of the $2^N$ switch combinations can be utilized if desired. FIG. 3a is a graph of the output current $I_L$ for each of the eight possible output states using the values of the single-switch configuration example. FIG. 3b is a similar graph for the resistor values of the cumulative-parallel configuration example. In each graph, the points at equal steps of ¼I are indicated by a box. In both graphs, it can be seen that when the bypass resistor values are configured to achieve four equal steps as discussed above, the minimum separation between current points diminishes as more resistors are switched into place. Accordingly, the number of additional detectable states may be limited by noise concerns. Therefore, it would be advantageous to introduce additional states without reducing the current point separation.

Figure 4:
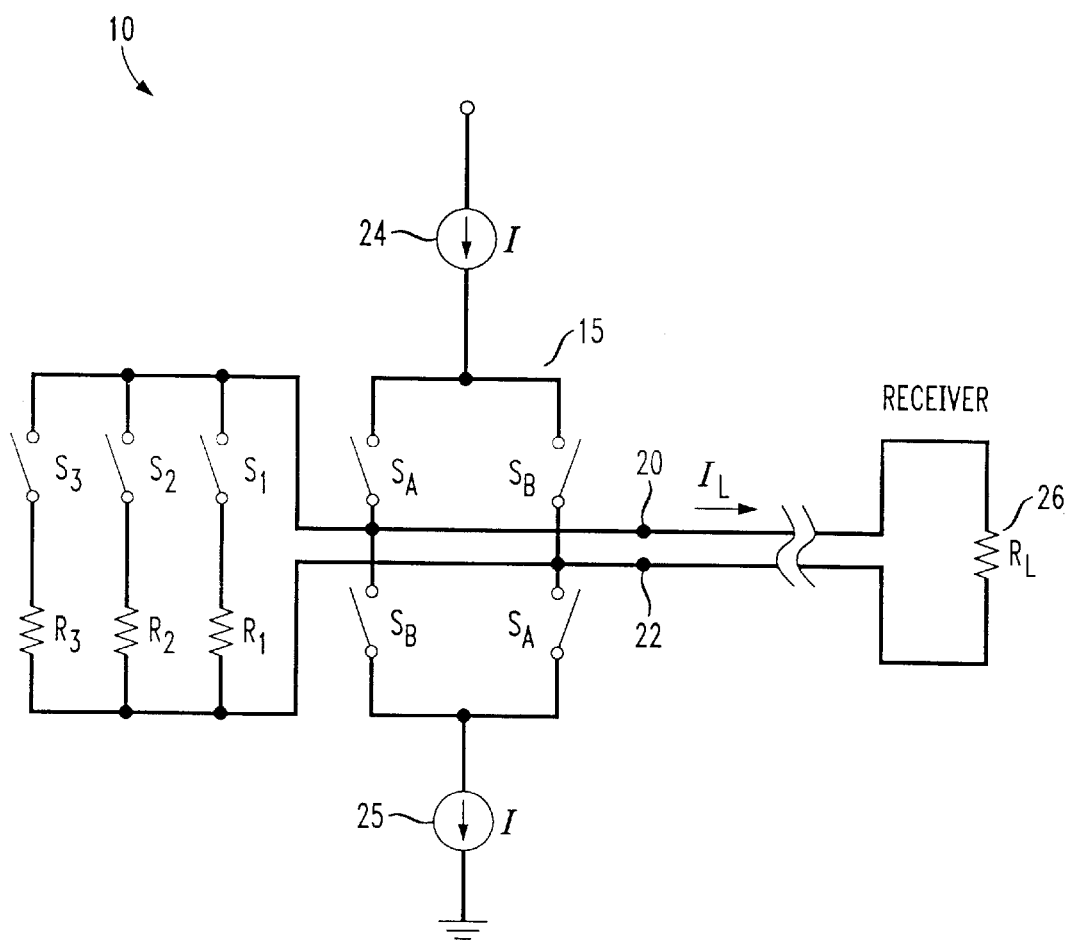
FIG. 4 is an ideal representation of an output circuit according to a second embodiment of the invention.

FIG. 4 shows the output driver 10 according to a second embodiment of the invention. In this invention, a current switch 15 is integrated with the driver of FIG. 2. Current switch 15 connects the current driver, here formed of matched current source 24 and current sink 25, to the output nodes 20, 22 via internal switch pairs $S_A$ and $S_B$. Although all four internal switches in a given current switch can be independently controlled, for purposes of this discussion, switches which are normally closed together are given the same designation and are discussed in pairs. When switch pair $S_A$ is open and switch pair $S_B$ is closed, current flows out from node 22 through the load 26 and back into node 20. When switch pair $S_A$ is closed and switch pair $S_B$ is open, current flows through the load in the opposite direction.

By including a current switch in the output circuit, the number of available current output states is doubled. In addition, a zero-current state can be achieved by opening or closing the internal switch pairs $S_A$ and $S_B$ in unison. Thus, for example, by using three switched bypass resistors configured as discussed above combined with a current switch as shown, eight primary output current states at steps of ¼I can be achieved. An additional, ninth zero-current state can also be achieved by opening or closing both switch pairs $S_A$ and $S_B$ together.

Accordingly, in this example, a three-bit digital output may be encoded in a single current signal. Advantageously, the circuit according to the present invention provides a wide and uniform separation between each of the current levels. This results in a robust output signal which can absorb a significant degree of noise, up to +/−⅛I, and still provide extractable data.

In the preferred embodiment, the conducting or non-conducting state of the bypass resistors (here shown as the state of resistor switches $S_1$ to $S_3$) and the state of current switch pairs $S_A$ and $S_B$ is controlled by conventional logic circuitry which converts a three-bit output value into appropriate control signal combinations. If the bypass resistors $R_1$ to $R_3$ are configured to be used in a single-switch arrangement, as discussed above for example, the nine output logic states may be encoded as follows:

| Output | $S_1$ | $S_2$ | $S_3$ | SA | SB | $I_L$ |
|---|---|---|---|---|---|---|
| 111 | 0 | 0 | 0 | 1 | 0 | +I |
| 110 | 1 | 0 | 0 | 1 | 0 | +¾ I |
| 101 | 0 | 1 | 0 | 1 | 0 | +½ I |
| 100 | 0 | 0 | 1 | 1 | 0 | +¼ I |
| — | — | — | — | both 1/0 | | 0 |
| 011 | 0 | 0 | 1 | 0 | 1 | −¼ I |
| 010 | 0 | 1 | 0 | 0 | 1 | −½ I |
| 001 | 1 | 0 | 0 | 0 | 1 | −¾ I |
| 000 | 0 | 0 | 0 | 0 | 1 | −−I |

A similar state table can easily be configured for the parallel-cumulative example discussed above. Appropriate logic circuitry can be designed directly from state tables such as this as is well known in the art.

Figure 5A:
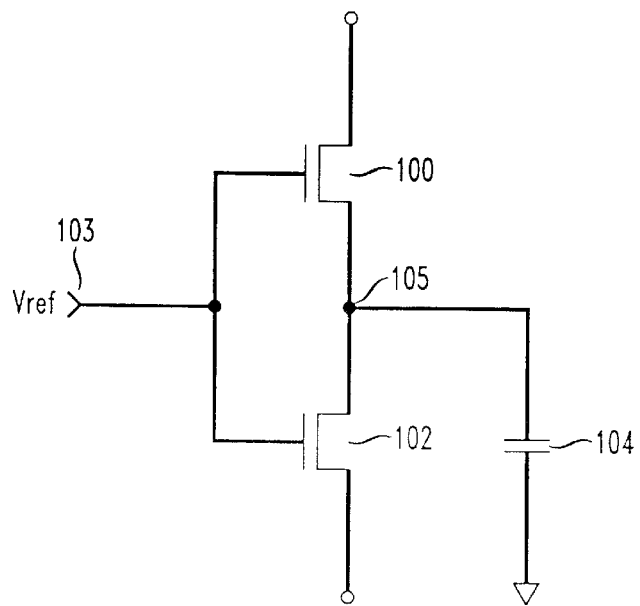
FIGS. 5a and 5b are circuit diagrams of switchable bypass resistors according to the invention.
Figure 5B:
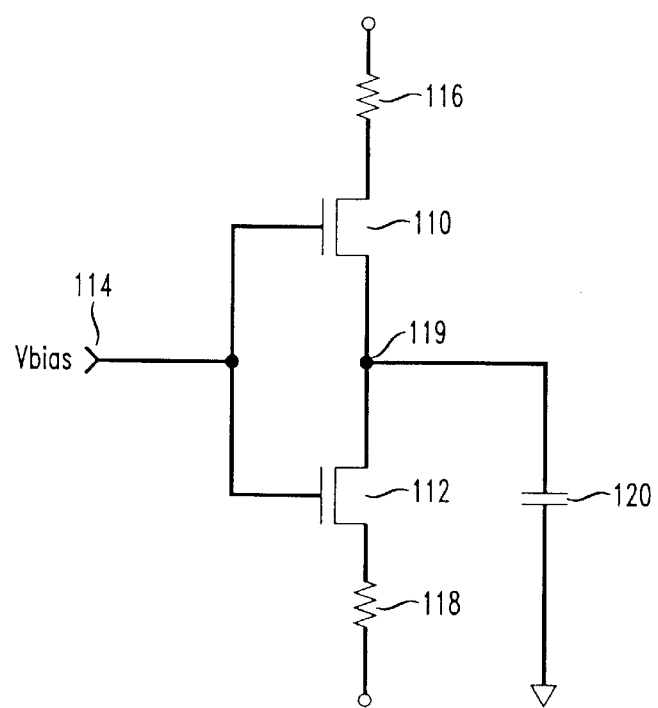

FIGS. 5a and 5b show preferred structures for implementing the switchable bypass resistors. In FIG. 5a, a switchable bypass resistor is implemented as two series-connected MOS transistors 100, 102 driven by a reference voltage Vref 103 which is adjusted so that the transistors 100, 102 are either non-conducting or resistively conducting. Preferably, a capacitor 104 is connected from node 105 (the junction of transistors 100, 102) to ground. Capacitor 104 serves to provide an AC ground for common mode signals which may be induced in the circuited in the circuit. Although only one MOS transistor is necessary, preferably two are used in combination with a capacitor because it is beneficial to have an AC ground at the center point.

In this embodiment, when the driving voltage Vref 103 is below the turn-on voltage for transistors 100, 102, the transistors are non-conducting. When a voltage greater the turn-on voltage (for NMOS transistors) is applied to the gates of transistors 100, 102, they conduct and have a specific resistance dependant on the geometry of each transistor and the applied voltage gate Vref 103. The proper biasing voltage to apply to a given MOS transistor so as to set it to a particular predefined resistance can be generated using feedback circuits. One such feedback circuit is described below.

According to another aspect of the invention. the output circuit is fabricated as an integrated circuit on a single chip so that all transistors in the circuit are exposed to the same fabrication conditions. A single bias voltage Vref may then be used for all of the switched bypass resistors implemented as MOS transistors by scaling various transistors relative to a "master" transistor that is biased to a known resistance. For example, if transistor 100 biased with a voltage V has a resistance R, a resistance of 2R may be achieved by applying the same biasing voltage V to a transistor with a channel width half that of transistor 100 and having the same length. Similarly, a resistance of 0.5R may be achieved by applying voltage V to a transistor having a channel twice as wide but the same length as transistor 100. Because all the transistors are fabricated with identical process conditions, errors introduced during fabrication cancel out.

FIG. 5b shows an alternative embodiment for implementing a switched bypass resistor. In this embodiment, two resistors 116, 118 are connected in series with two MOS transistors 110, 112. The transistors are driven by a biasing voltage Vbias 114. Preferably, a capacitor 120 is connected between the junction of the transistors 110, 112 (node 119) and ground. As above, in the "off" condition, the transistors 110, 112 are non-conducting. However, in the "on" state, the transistors are driven with a biasing voltage sufficient to place them in a saturated state so that their internal resistance is small when compared with resistors 116, 118. In this embodiment, the transistors are preferably driven using digital signals of appropriate magnitudes. The resistors can be fabricated using any appropriate technique and can be on- or off-chip passive devices, or even appropriately biased transistors.

Figure 6A:
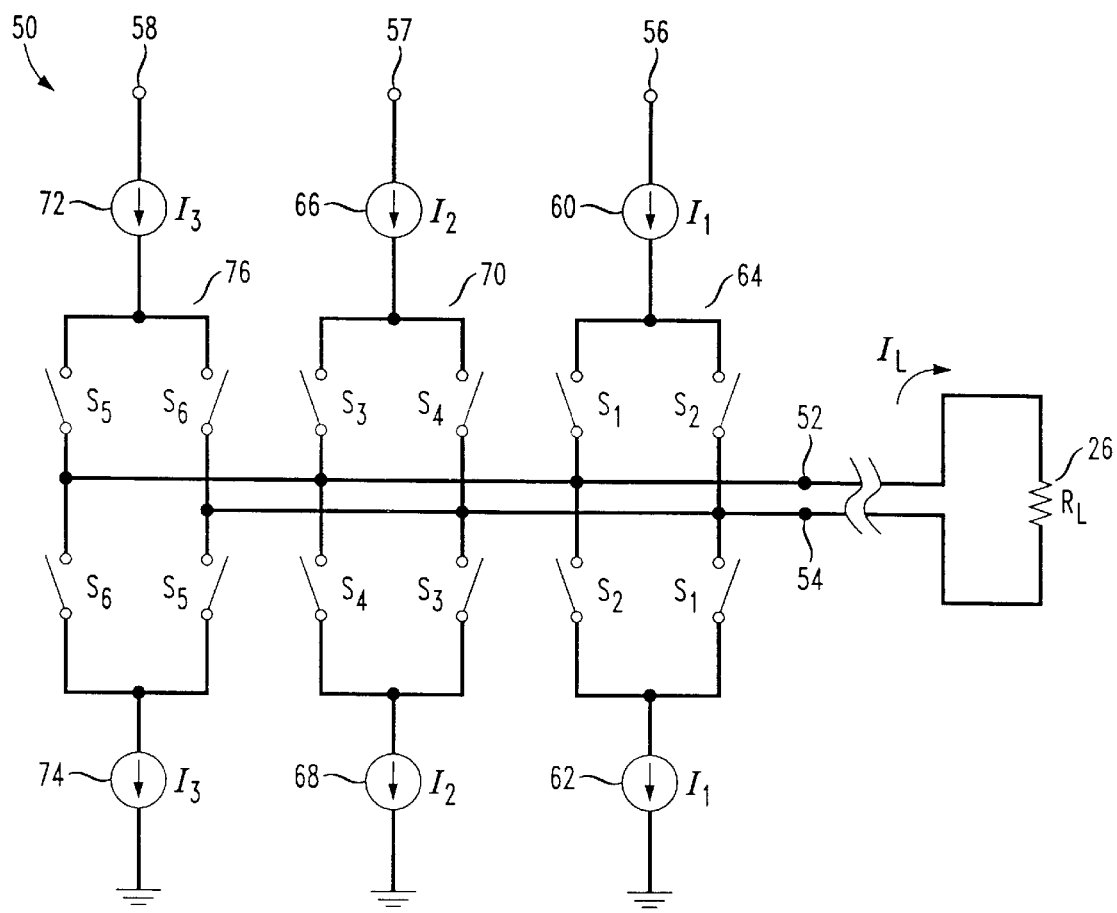
FIGS. 6a–6c are ideal representations of an output circuit according to a third embodiment of the invention.

FIG. 6a is an ideal representation of a third embodiment of the invention. As shown, current output circuit 50 consists of a plurality of current drivers, in this example drivers 56, 57, 58, which are connected in parallel to output nodes 52, 54, and thereby to a load resistor $R_L$ 26, representing an attached receiving device. Each of the current drivers preferably includes a matched current source and sink connected to the output nodes by a current switch. Driver 56 includes current source and sink 60, 62 which provide a current $I_1$ through current switch 64 having switch pairs $S_1$ and $S_2$. Driver 57 includes current source and sink 66, 68 which provide current $I_2$ through current switch 70 having switch pairs $S_3$ and is $S_4$. Driver 58 includes current source and sink 72, 74 which provide current $I_3$ through current switch 76 having switch pairs $S_5$ and $S_6$.

According to this aspect of the invention, the output current $I_L$ through load 26 may be varied by selectively providing various combinations of currents $_{I1}$ to $_{I3}$, in either direction, via the current drivers 56, 57, 58. Further according to the invention, the resistance of switch pairs $S_1$–$S_6$, when conducting, is set to various predefined values. Each switch thus functions as a switchable bypass resistor as discussed above. In addition, all of the internal switches in a given current switch are configured so that the net resistance for each path between the given current source and current sink is equivalent. This ensures that when all internal switches in a given current switch are closed, half the switched current flows in one direction through the load and half flows in the other direction.

In this state, no net current is introduced into the load from the particular current driver and therefore, the particular switched current can be ignored. According to the invention, however, because the closed internal switches have a pre-defined resistance, closing both switch pairs also introduces a predetermined effective resistance in parallel with the load. This diverts current flow from other current drivers and thereby reduces the current in the load by a particular amount. The resistances of the internal switches and thereby the effective resistance associated with each current driver is chosen to provide for a plurality of discretely selectable current levels through the load in a manner similar to that discussed above with respect to FIGS. 2–4.

Each internal switch in a switch pair S can be considered an ideal switch in series with a resistor R or a voltage-controlled resistor. For purposes of clarity, when a given switch is open, i.e., when the resistor is not conducting, only the open-switch portion is shown in the figures. When an internal switch is closed, i.e., the resistor is conducting, it is represented as the equivalent resistance. It can be appreciated that each internal switch in each of the current switches 64, 70, 76 can have a different internal resistance subject to the constraint, in this embodiment, that the two current paths in a given current switch, i.e., the path through each pair of switches, have equivalent resistances to allow for a zero net current flow state as previously discussed. For purposes of simplicity, it is assumed that each of the four internal switches comprising a given current switch 64, 70, 76 have the same internal resistance, defined as $R_{64}$, $R_{70}$, $R_{76}$, respectively.

Figure 6B:
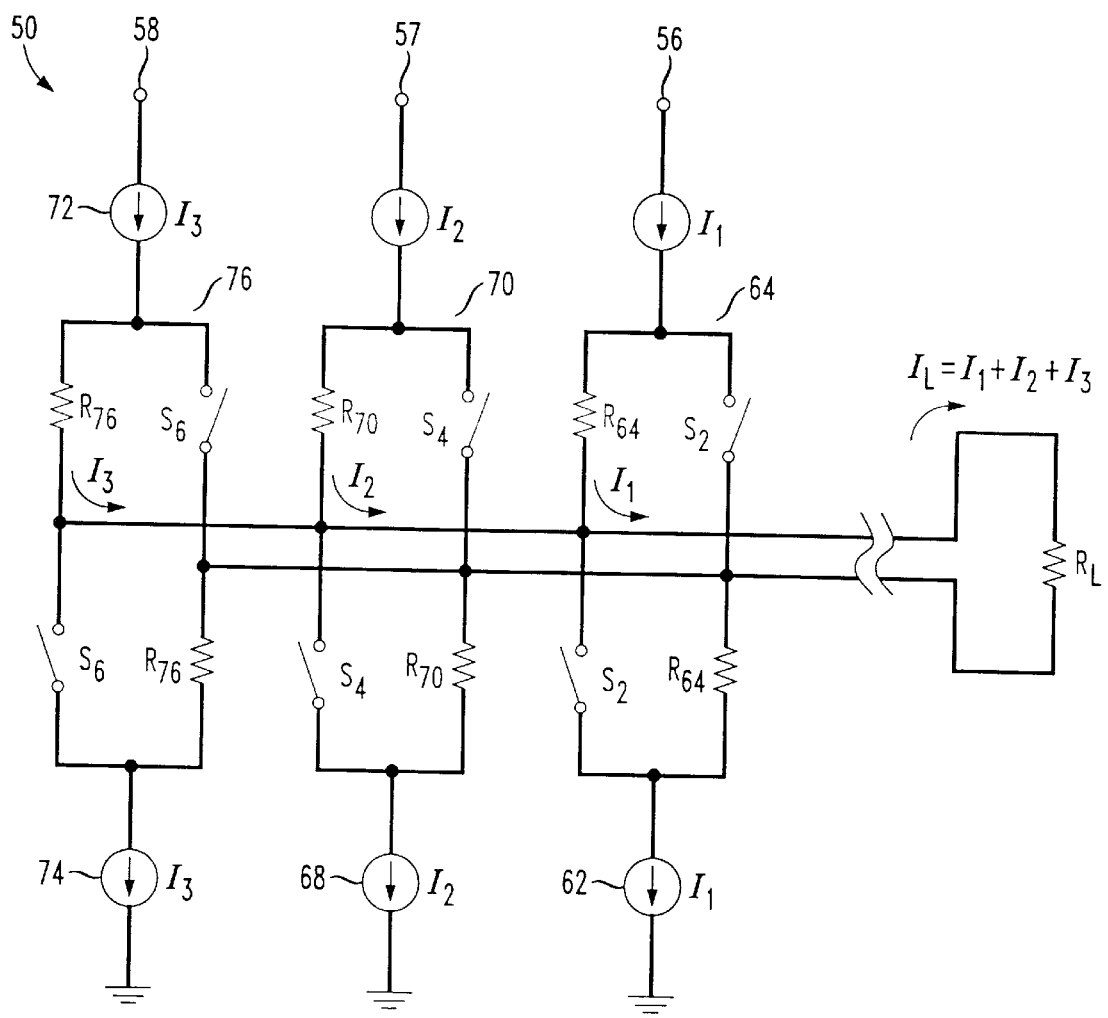

FIG. 6b is an illustration showing the circuit 50 with switch pairs $S_1$, $S_3$, and $S_5$ closed and replaced with their equivalent switch resistances, $R_{64}$, $R_{70}$, $R_{76}$. Because each resistance is introduced in series between a current source/sink and the load, the internal resistances do not affect the net current flow, only the voltage drop across the load. Thus, the net current flow $I_L$ through load resistor $R_L$ is $I_1+I_2+I_3$. This sum is defined as the maximum output current I. (Analogously, if switch pairs $S_2$, $S_4$, and $S_6$ were closed, the total current through the load would be -I).

Figure 6C:
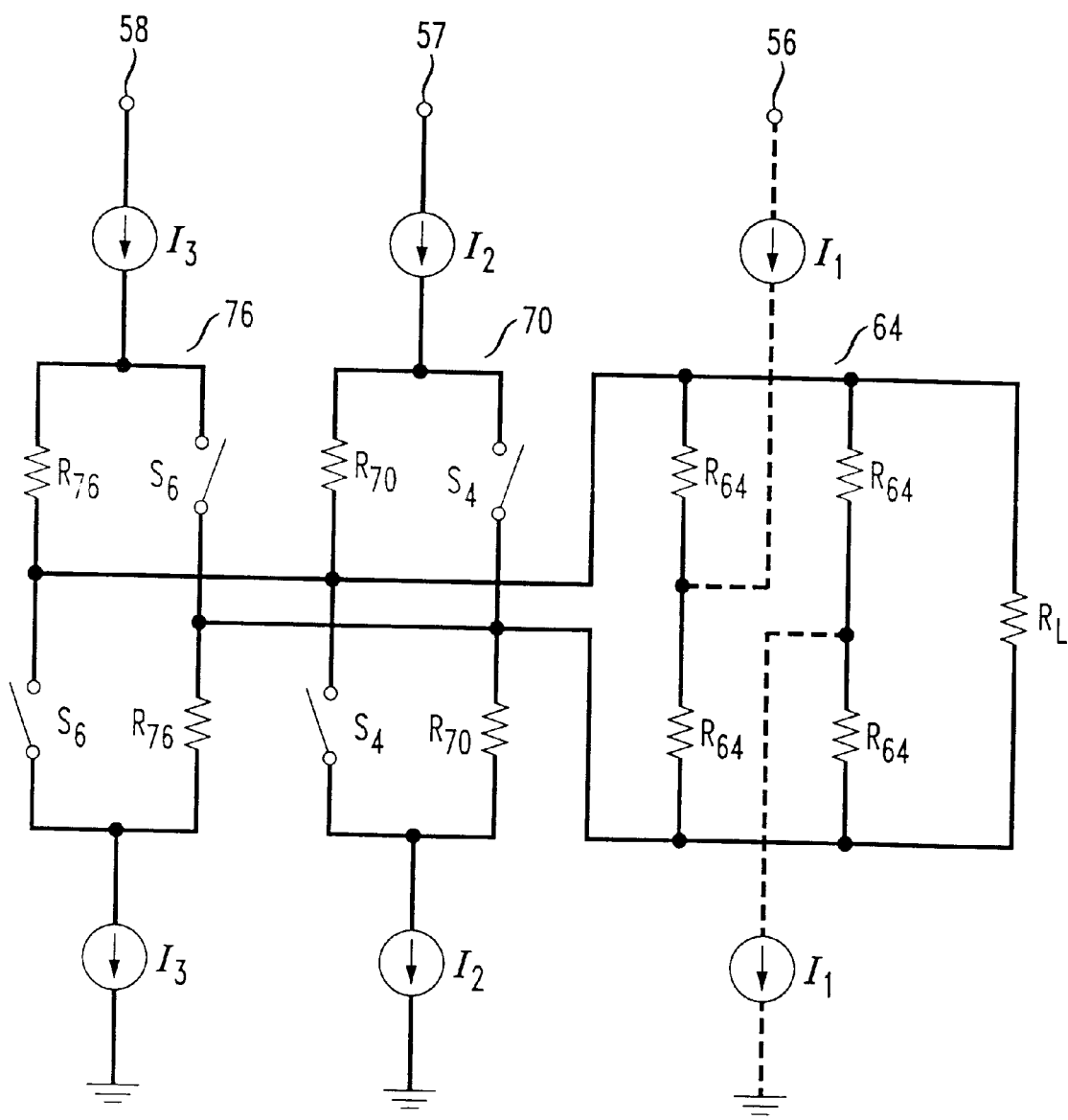

FIG. 6c is an illustration showing the circuit 50 with switch pairs $S_3$, and $S_5$ closed and replaced with their equivalent switch resistances, $R_{70}$, $R_{76}$. In addition, current switch 64 has both switch pairs $S_1$ and $S_2$ closed and is therefore in a zero net current state. Therefore, current $I_1$ is not contributing current to the load because the effect of switched current $I_1$ is equal in both directions. Note, however, that the $I_1$ current is still flowing, and therefore, switching noise and start-up delays associated with stopping current flow are not introduced. The total contributing current flow is $I_2+I_3$. However, as shown in the figure, the internal switch resistances from current switch 64 are now in parallel with the load resistor $R_L$. This introduces a parallel aggregate resistance of $(R_{64}+R_{64})\|(R_{64}+R_{64})R_{64}$, where "$\|$" signifies a parallel combination. This bypass resistance diverts a portion of the $I_2+I_3$ current, thereby reducing the output current $I_L$. According to the invention, the parallel equivalent resistance (and thus each internal switch resistance) $R_{64}$ is chosen to provide a particular output current in a manner similar to that discussed above for FIGS. 2–5. Preferably, the switchable resistors used in switch pairs $S_1$–$S_6$ are implemented as MOS transistors as shown in FIGS. 5a and 5b, discussed above, as are the current drivers 60, 66, and 72, and the reference voltage circuit which applies the appropriate gate voltage(s).

In one configuration, for example, $I_1=0.1I$, $I_2=0.3I$, and $I_3=0.6I$ and the resistances $R_{64}$, $R_{70}$, and $R_{76}$ are set to $2R_L$, $\frac{2}{3}R_L$, and $\frac{1}{3}R_L$, respectively. When all three current switches 64, 70, and 76 are contributing current in the same direction (FIG. 6b), the net current flow is I. When current switch 64 is set to a non-contributing state as shown in FIG. 6c, current $I_1$ does not contribute to the load and a resistance of $R_{64}=2R_L$ is placed in parallel with the load resistance $R_L$. Because currents $I_2$ and $I_3$ remain contributing, the total sourced current is $0.3I+0.6I=0.9I$. $R_L$ is in parallel with a bypass resistance equal to $2R_L$ and so the current sourced to the load is $0.9I*2R_L/(R_L+2R_L)=0.9I*2/(1+2)=0.6I$. Similarly, in the case where switch pairs $S_1$, $S_2$, $S_3$, $S_4$, and $S_5$ are closed, only the current driver 58 is contributing $I_3=0.6I$ and the resulting load current is 0.2I. Similar calculations can be performed for other current switch states as well. One group of switch states for this embodiment and the resulting load current is summarized in the following table, where a 1 indicates that a switch pair is closed and a 0 indicates that a switch pair is open.

| $S_1$ | $S_2$ | $S_3$ | $S_4$ | $S_5$ | $S_6$ | $I_L$ |
|---|---|---|---|---|---|---|
| 0 | 1 | 0 | 1 | 0 | 1 | I |
| 1 | 1 | 1 | 0 | 1 | 0 | 0.6 I |
| 1 | 1 | 1 | 1 | 1 | 0 | 0.2 I |
| 1 | 1 | 1 | 1 | 1 | 1 | 0 |
| 1 | 1 | 1 | 1 | 0 | 1 | -0.2 I |
| 1 | 1 | 0 | 1 | 0 | 1 | -0.4 I |
| 0 | 1 | 0 | 1 | 0 | 1 | -I |

Figure 7A:
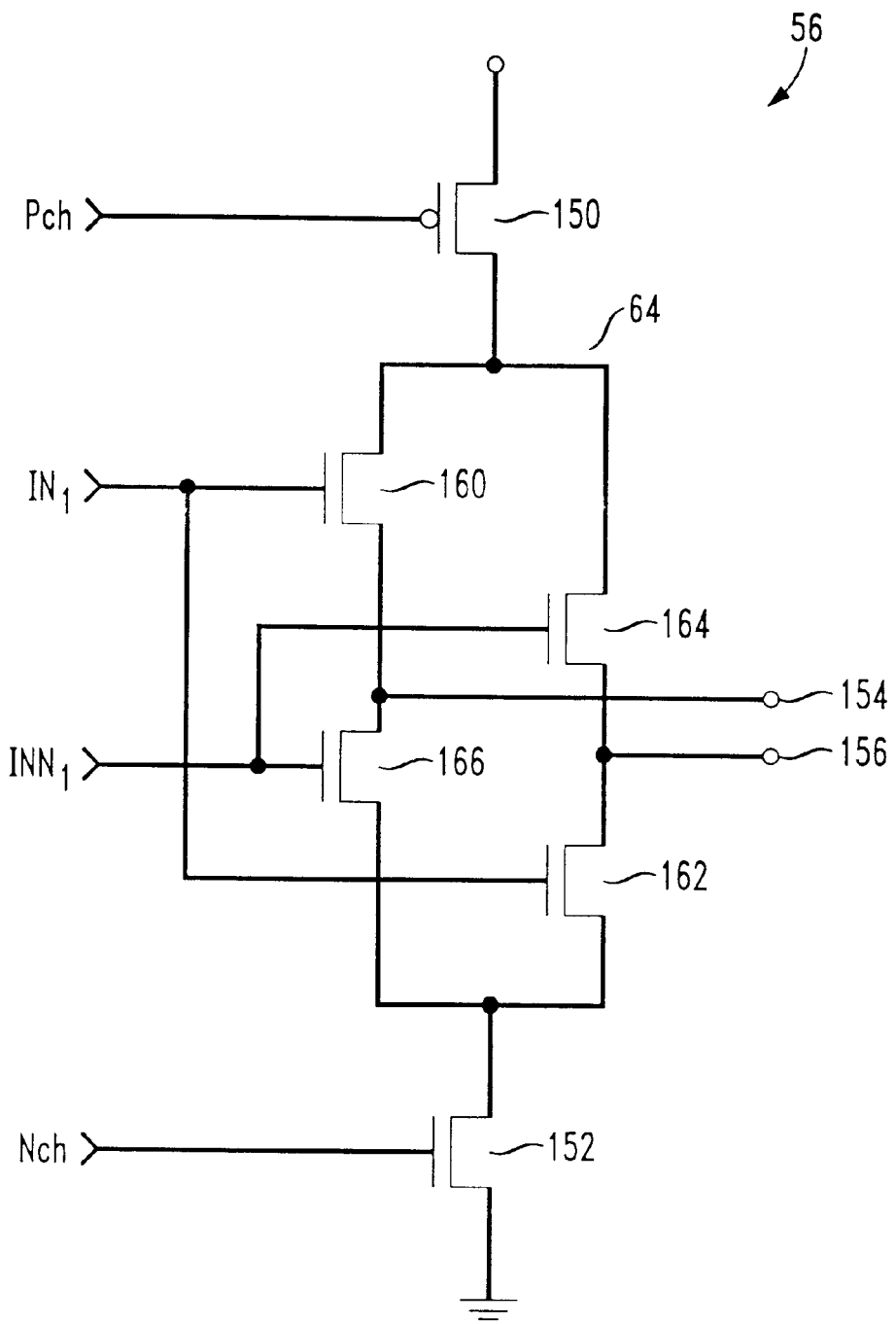
FIGS. 7a–7c show circuit diagrams of the preferred implementation of the circuits of FIGS. 6a according to one specific implementation of this particular embodiment.
Figure 7B:
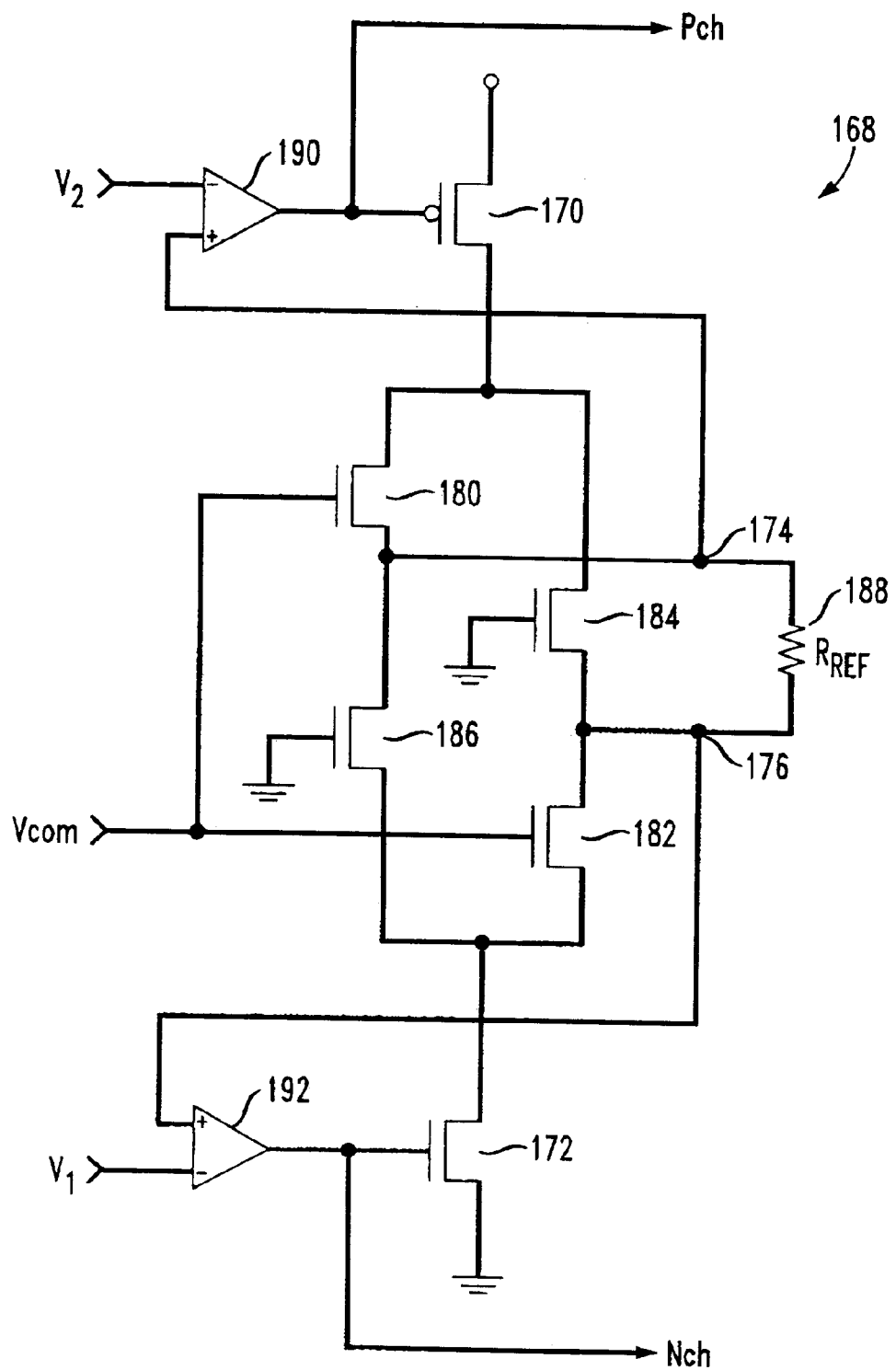
Figure 7C:
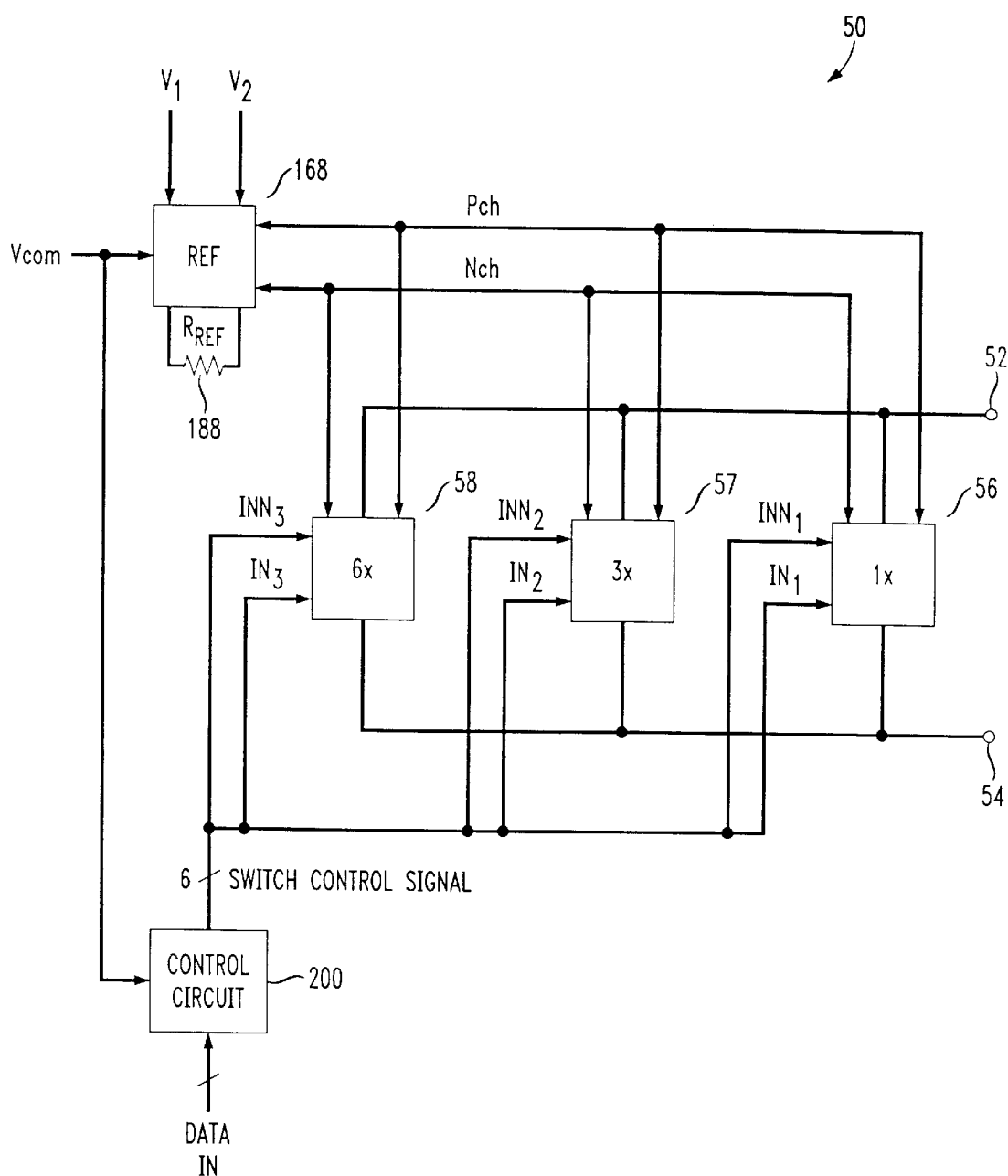

FIGS. 7a–7c show circuit diagrams of a preferred implementation of this particular embodiment, using the selected values from the previous example. All components except for a single reference resistor are implemented as MOS transistors. All transistors preferably have the same gate length, most preferably the minimum value supported in a given fabrication technology, but may have varying gate widths. According to one aspect of the invention, the entire output circuit is fabricated as part of a single integrated circuit where the current output circuits are simply scaled versions of each other. In a simple scaling scheme, the lengths of the transistor gates are kept constant, while the widths of the gates are adjusted to provide the desired relative resistance and/or current.

Turning now to FIG. 7a, representative current driver 56 consists of a current source formed by p-channel MOS transistor 150 biased to a gate voltage Pch, and a current sink formed by N-channel MOS transistor 152 biased to a gate voltage Nch, which together produce current $I_1$. Transistors 150 and 152 have gate widths of 70 and 18 microns, respectively, and are connected to output nodes 154, 156 through a current switch 64 formed by N-channel transistors 160, 162, 164, and 166, having gate widths of 95, 50, 95, and 50 microns respectively. The gates of transistors 160 and 162 are connected to input voltage $IN_1$ and together correspond to switch pair $S_1$ shown in FIG. 6a. The gates of transistors 164 and 166 are connected to input voltage $INN_1$ and together correspond to switch pair $S_2$ shown in FIG. 6a. The input gate voltages $IN_1$ and $INN_1$ are set to either turn off the given transistors (i.e., zero volts), or bias them to a common voltage, Vcom, which places them in a resistive conducting state having the desired resistance.

FIG. 7b is one embodiment of a voltage reference circuit 168 for generating the bias voltages Pch and Nch for transistors 150 and 152. The circuit consists of a current source formed by P-channel transistor 170 and a current sink formed by N-channel transistor 172. The current driver formed by transistors 170 and 172 is connected to output nodes 174, 176 through a current switch formed by N-channel transistors 180, 182, 184, and 186, which are connected as shown. The gates of transistors 180 and 182 are driven by a bias voltage Vcom which places them in a resistive conducting state. The particular resistance of these switches is set by adjusting the value of Vcom as desired and will be discussed below. The gates of transistors 184 and 186 are grounded and therefore, these transistors are non-conducting.

A reference resistance $R_{REF}$ 188 is connected across nodes 174 and 176. Resistor 188 is chosen to have a resistance equal to the expected load resistance $R_L$ 26 which will be connected to the output buffer. The geometric dimensions of transistors 170, 172, 180, 182, 184, and 186 correspond symmetrically to transistors 150, 152, 160, 162, 164, and 166 respectively (FIG. 7a). Preferably, corresponding transistors have the same dimensions. Because the circuits of FIG. 7a and 7b correspond geometrically, it can be appreciated that once the bias voltages for transistors 170 and 172 are set to provide a specific current through known resistance $R_{REF}$ 188, i.e., a current equal to $I_1$, these bias voltages can then be applied to corresponding transistors in output buffer circuits 56 to produce currents with a predefined magnitude when driving a load having resistance equal to $R_{REF}$.

The proper biasing voltages, Pch and Nch, are generated using feedback comparators 190 and 192. Comparator 190 is driven by input voltage V2 and the voltage at node 174 and its output is used to bias transistor 170. This circuit will adjust the biasing of transistor 170 until the sourced current places the voltage at node 174 equal to V2. Similarly, comparator 192 is driven by input voltage V1 and the voltage at node 176 and its output used to bias transistor 172. This circuit will adjust the bias of transistor 172 until the sunk current places the voltage at node 176 equal to V1. Since the reference resistance $R_{REF}$ 188 is known, the voltage drop across the resistor 188 can be set to provide the desired current, i.e., $I=(V2-V1)/R_{REF}$. For example, with a resistance of 100 Ohms, a set voltage drop between 2.4 and 2 volts would result in a current of 4 milliamps.

Voltage reference circuits of this type are described in more detail in commonly assigned U.S. patent application Ser. No. 08/882,827 entitled "Low Voltage Differential Swing Interconnect Buffer Circuit," filed on Jun. 26, 1997, the entire contents of which are hereby incorporated by reference.

FIG. 7c shows a complete output circuit implementing the specific example discussed above and using the circuits of FIGS. 7a and 7b. As shown, reference circuit 168 generates bias voltages Pch and Nch based on reference resistor 188 and input voltages V1, V2, and Vcom. In this example, voltages V1 and V2 have a difference of several hundred millivolts, i.e., V1=1.0 volts and V2=1.4 volts. A plurality of output drivers are connected in parallel between output nodes 52 and 54. The output circuit 56 shown in FIG. 7b corresponds to the "1x" output circuit. Circuits 57 and 58 are scaled versions of circuit 56, where the transistors have gate widths of 3x and 6x, respectively, of the corresponding transistors in circuit 56. Accordingly, if circuit 56 is defined to produce output current $I_1=0.1I$, circuit 57 will produce $I_2=3*I_1=0.3I$, and circuit 58 will produce output current $I_3=6*I_1=0.6I$. The switch states of each output driver are controlled by a digital control circuit 200, which implements, for example. the state table shown above by providing a zero or ground voltage to a given transistor gate when it is to be non-conducting and providing an output voltage equal to Vcom when a switch is to be in a conducting state. Control circuits of this type are well known in the art.

Figure 8:
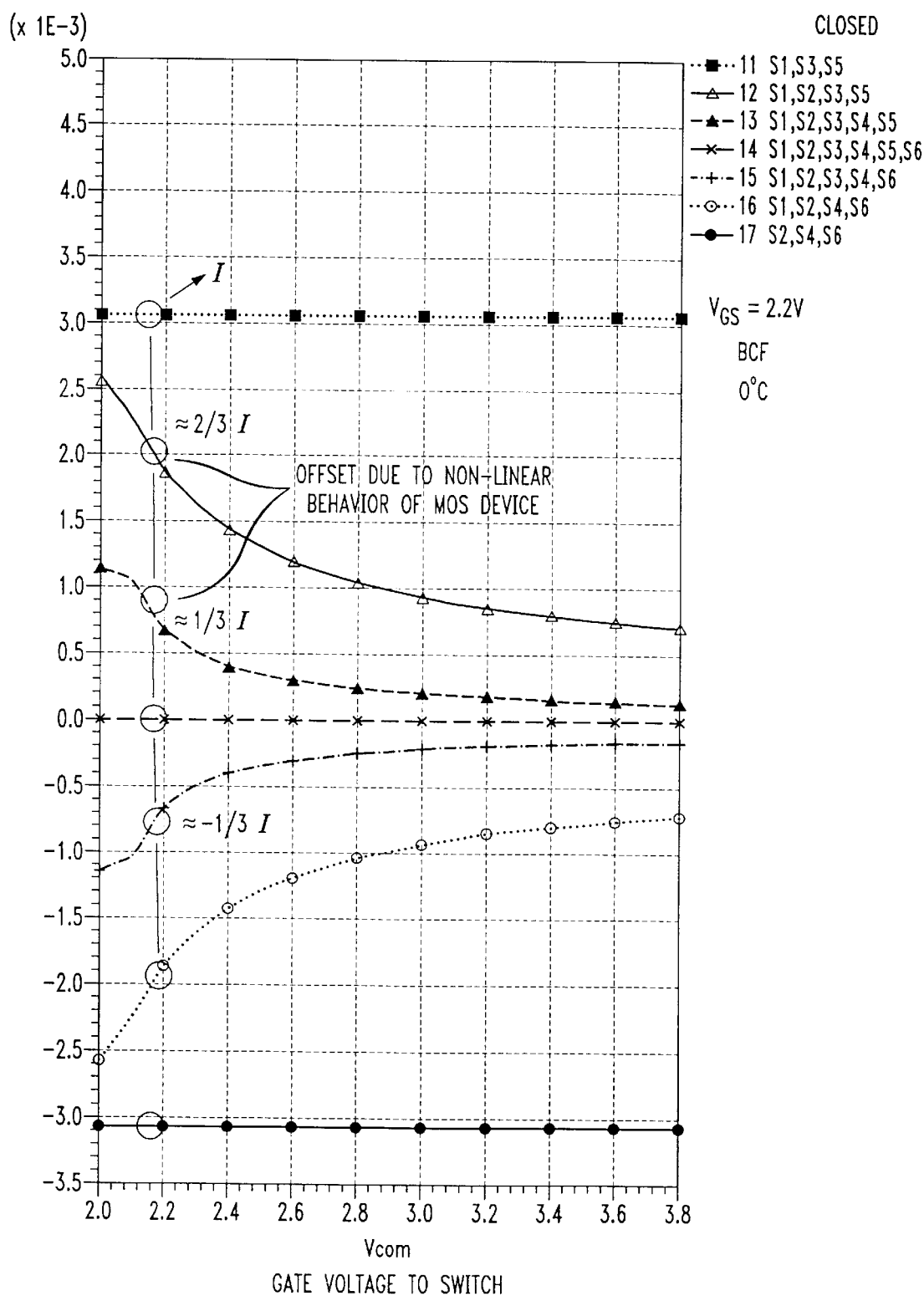
FIG. 8 is a graph of the output currents for the circuit of FIGS. 7a–7c with a varying transistor bias voltage.

As mentioned above, varying the biasing voltage for conducting transistors (i.e., Vcom) results in different output currents because the resistance of the transistors is varied. FIG. 8 is a graph of simulated output currents for the example circuit discussed above with Vcom varied between 2.0 volts and 3.8 volts. As can be seen, results generally in line with the ideal situation are achieved with a driving voltage Vcom of approximately 2.2 volts. Various methods of producing the appropriate driving voltage are known to those skilled in the art and include, for example, resistive divider circuits, feedback circuits, etc.

While the invention has been particularly shown and described with reference to preferred embodiments thereof, it will be understood by those skilled in the art that various changes in form and details may be made therein without departing from the spirit and scope of the invention.

What is claimed is:

1. An integrated circuit including a current output circuit having first and second output nodes connectable to a load, said output circuit comprising:
   a plurality of current drivers; and
   a plurality of current switches, each said current switch associated with a respective current driver for connecting the output of the respective current driver to at least one output node, each said current switch comprising first and second switches forming a first switch pair having a particular resistance when conducting, and third and fourth switches forming a second switch pair having substantially said particular resistance when conducting;
   each said current switch having at least three states, wherein
      in the first state, said first switch pairs being closed and said second switch pairs being open to connect the respective current driver of the current switch to said output nodes, whereby current flows from said first output node through the load, when connected, and into said second output node;
      in the second state, said first switch pairs being open and said second switch pairs being closed to connect the respective current driver of the current switch to said output nodes, whereby current flows from said second output node through the load, when connected, and into said first output node; and
      in the third state, both said first and second switch pairs being closed to thereby introduce a resistance in parallel with said load, when connected, the net current through said connected load from said respective current driver being substantially zero.

2. The circuit of claim 1, wherein each of said current drivers supplies a current of a different magnitude.

3. The circuit of claim 1, further comprising a control circuit receiving digital data as input and providing output signals to control the states of said switch pairs in said plurality of current switches.

4. The circuit of claim 1, wherein each of said first through fourth switches in said current switches is an MOS transistor.

5. The circuit of claim 4, wherein each said MOS transistor has a control signal appearing at the gate thereof, said MOS transistor being non-conducting when the magnitude of said control signal is a first voltage, said MOS transistor being conducting and having a particular predetermined resistance when said control signal is a second voltage.

6. The circuit of claim 5, wherein said MOS transistors forming said first through fourth switches in one of said current switches are scaled versions of corresponding MOS transistors forming first through fourth switches in a second one of said current switches, each of the control signals for said scaled MOS transistors being switchable between substantially the same first and second voltage magnitudes as the control signals for said corresponding MOS transistors.

7. The circuit of claim 6, further comprising:
   a control circuit receiving digital data as input and providing output signals to control the states of said switch pairs in each one of said current switches.

8. An integrated circuit as claimed in claim 1 wherein a said current source comprises:
   a current source including an MOS transistor biased to a source reference voltage;
   a current sink including an MOS transistor biased to a sink reference voltage;
   and a said current switch comprises a resistive current switch connecting said current source and said current sink of the corresponding switch to said first and second output nodes, said current switch including:
- a first MOS transistor connected between said current source and said first output node;
- a second MOS transistor connected between said second output node and said current sink;
- a third MOS transistor connected between said current source and second output node; and
- a fourth MOS transistor connected between said first output node and said current sink;

a first control signal connected to the gates of said first and second transistors;

a second control signal connected to the gates of said third and fourth transistors;

said transistors in each one of said drivers being scaled versions of corresponding transistors in each other one of said drivers;

said controlled first and second transistors being non-conducting when said first control signal is at a first voltage and being resistively conducting when said first control signal is at a second voltage;

said controlled third and fourth transistors being non-conducting when said second control signal is at substantially said first voltage and being resistively conducting when said second control signal is substantially said second voltage.

9. The circuit of claim 8, further comprising means for generating said source and sink reference voltages.

10. The circuit of claim 8, further comprising a control circuit receiving digital data as input and providing said first and second control signals for each of said drivers.

11. A current output circuit for an integrated circuit, said output circuit comprising:

first and second output nodes connectable to a load;

a current driver and a current switch associated with said current driver for connecting the current driver to at least one output node, said current switch comprising first and second switches forming a first switch pair having a particular resistance when conducting and third and fourth switches forming a second switch pair having substantially said particular resistance when conducting;

said current switch have three states, wherein
- in the first state, said first switch pairs being closed and said second switch pairs being open to connect said current driver to said output nodes, whereby current flows from said first output node through the load, when connected, and into said second output node;
- in the second state, said first switch pairs being open and said second switch pairs being closed to connect said current driver to said output nodes, whereby current flows from said second output node through the load, when connected, and into said first output node; and
- in the third state, both said first and second switch pairs being closed to thereby introduce a resistance in parallel with said load, when connected, the net current through said connected load from said respective current driver being substantially zero.

* * * * *